United States Patent
Li et al.

(10) Patent No.: US 9,053,678 B2
(45) Date of Patent: Jun. 9, 2015

(54) SHIFT REGISTER UNIT CIRCUIT, SHIFT REGISTER, ARRAY SUBSTRATE AND LIQUID CRYSTAL DISPLAY

(75) Inventors: Tianma Li, Beijing (CN); Xiaojing Qi, Beijing (CN); Haigang Qing, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 418 days.

(21) Appl. No.: 13/472,868

(22) Filed: May 16, 2012

(65) Prior Publication Data

US 2012/0293401 A1 Nov. 22, 2012

(30) Foreign Application Priority Data

May 16, 2011 (CN) .......................... 2011 1 0126582

(51) Int. Cl.
- G09G 3/36 (2006.01)
- G11C 19/18 (2006.01)
- G11C 19/28 (2006.01)

(52) U.S. Cl.
CPC ...... G09G 3/3677 (2013.01); *G09G 2300/0408* (2013.01); G11C 19/184 (2013.01); G11C 19/28 (2013.01); *G09G 2310/0286* (2013.01)

(58) Field of Classification Search
CPC .............................. G09G 3/3611–3/38; G09G 2310/02–2310/0229; G09G 2310/0243–2310/0259; G09G 2310/0264–2310/08; G09G 2300/04–2300/0434; G11C 19/184; G11C 19/28

USPC .................. 315/169.2; 345/87–104, 211–213
See application file for complete search history.

(56) References Cited

U.S. PATENT DOCUMENTS

| | | | |
|---|---|---|---|
| 6,559,824 B1 * | 5/2003 | Kubota et al. ................. | 345/100 |
| 2003/0128180 A1 * | 7/2003 | Kim et al. ..................... | 345/100 |
| 2004/0189584 A1 * | 9/2004 | Moon ........................... | 345/100 |
| 2004/0239608 A1 * | 12/2004 | Chung .......................... | 345/100 |
| 2005/0264514 A1 * | 12/2005 | Kim et al. ..................... | 345/100 |
| 2007/0035505 A1 * | 2/2007 | Lin et al. ...................... | 345/100 |
| 2007/0296681 A1 * | 12/2007 | Kim et al. ..................... | 345/100 |
| 2008/0219401 A1 * | 9/2008 | Tobita ............................ | 377/79 |
| 2008/0285705 A1 * | 11/2008 | Wei et al. ....................... | 377/78 |
| 2009/0073105 A1 * | 3/2009 | Chiang et al. ................. | 345/100 |

(Continued)

FOREIGN PATENT DOCUMENTS

| | | | |
|---|---|---|---|
| CN | 101556833 A | 10/2009 | |
| CN | 10145308 A | 2/2010 | |

(Continued)

Primary Examiner — Sanghyuk Park
(74) Attorney, Agent, or Firm — Ladas & Parry LLP

(57) ABSTRACT

Embodiments of the disclosed technical solution provides a shift register unit circuit which operates based on two clock signals and comprises input terminals, a pre-charging circuit, a first level pulling-down circuit, a second level pulling-down circuit and a scan signal output terminal. Embodiments of the disclosed technical solution also provides a shift register having at least two shift register unit circuits connected in cascade, and further provides a liquid crystal display array substrate and a liquid crystal display. Embodiments of the disclosed technical solution settles problems that a threshold voltage of the pulling-down TFT would drift under a direct current bias voltage and a output is unstable due to a clock hopping, increases a reliability of the circuit and reduces power consumption.

18 Claims, 6 Drawing Sheets

(56) References Cited

U.S. PATENT DOCUMENTS

2010/0156858 A1* 6/2010 Moon et al. .................. 345/204
2011/0058640 A1   3/2011 Shang et al.
2011/0199365 A1* 8/2011 Umezaki et al. ............. 345/212
2011/0316834 A1* 12/2011 Lee et al. ..................... 345/211

FOREIGN PATENT DOCUMENTS

| | | |
|---|---|---|
| CN | 102012591 A | 4/2011 |
| JP | 2000-235374 A | 8/2000 |
| KR | 20040003287 A | 1/2004 |

* cited by examiner

SHIFT REGISTER UNIT CIRCUIT, SHIFT REGISTER, ARRAY SUBSTRATE AND LIQUID CRYSTAL DISPLAY

BACKGROUND

A disclosed technical solution relates to a shift register unit circuit, a shift register, an array substrate and a liquid crystal display.

The liquid crystal display is a plane display which employs glass substrate as the substrate, and forms color film structure and TFT circuit structure on the glass substrate. In order not to increase any process and manufacture cost, a manufacture process for forming TFTs (Thin Film Transistor) in a pixel circuit is employed to manufacture a driving circuit to make the pixel circuit and the driving circuit on a same substrate only by designing a GOA circuit (for example, a principle view of the shift register unit circuit in the GOA circuit as shown in FIG. 1). In this case, a best scenario is to use transistors of TFT same different-electricity type to form the driving circuit including the shift register so as to reduce the manufacture costs. However, in prior art, the shift register unit circuit formed by the transistors of TFT same different-electricity type has problems that a threshold voltage of pulling-down TFT would produce an drift under a direct current bias voltage and an output tends to be unstable when a clock hops, which affect an operation reliability of the shift register.

SUMMARY

For the above problems, the disclosed technical solution provides a shift register unit circuit, a shift register, an array substrate and a liquid crystal display which may effectively improve the drift and stabilize the output.

According to an embodiment, the shift register unit circuit comprises:

input terminals including a start signal input terminal, a first clock signal input terminal and a second clock signal input terminal;

a pre-charging circuit for outputting a turn-on level in response to the enable level of a start signal and of a first clock signal, and keeping the turn-on level being output during one clock period of the first clock signal;

a first level pulling-down circuit for pulling down the turn-on level output from the pre-charging circuit and outputting a low level, after the turn-on level is input; and for outputting the low level in response to an enable level of the first clock signal and a disable level of a second clock signal, and outputting a high level in response to the disable level of the first clock signal and the enable level of the second clock signal, after the turn-on level is turned off;

a second level pulling-down circuit, which is coupled to an output terminal of the first level pulling-down circuit, for pulling down a level at an output terminal of the second level pulling-down circuit and outputting the low level in response to the high level output from the first pulling-down circuit; for pulling down the level at the output terminal of the second level pulling-down circuit and outputting the low level in response to the enable level of the first clock signal; and for outputting the high level in response to the low level output from the first level pulling-down circuit and the disable level of the first clock signal; and a scan signal output terminal, which is coupled to the output terminal of the second level pulling-down circuit, for outputting a scan signal.

Further, the first level pulling-down circuit comprises a first inverting circuit, a level pulling-up circuit and a first level pulling-down sub-circuit, wherein:

the first inverting circuit pulls down the level at the output terminal of the first inverting circuit and outputs the low level after the turn-on level is input; and outputs the high level after the turn-on level is turned off;

the level pulling-up circuit pulls up the high level output from the first inverting circuit and outputs a high level in response to the enable level of the second clock signal;

the first level pulling-down sub-circuit pulls down the high level output from the level pulling-up circuit and outputs the low level in response to the enable level of the first clock signal.

In a detail implementation, the pre-charging circuit comprises a first switch, a first node and a capacitor, wherein:

a gate of the first switch is connected to the first clock signal, a drain thereof is connected to the start signal, and a source thereof is coupled to the first node;

the first node is a turn-on level output terminal of the pre-charging circuit; and one terminal of the capacitor is coupled to the first node, and the other terminal is coupled to the low level.

In a detailed implementation, the first inverting circuit comprises a second switch, a second node and a third switch, wherein:

a gate and a drain of the second switch are coupled to each other, the drain is connected to the high level, and a source of the second switch is coupled to the second node;

the second node is the output terminal of the first inverting circuit;

a gate of the third switch is connected to the turn-on level output terminal of the pre-charging circuit, a drain thereof is coupled to the second node, and a source thereof is connected to the low level.

In a detailed implementation, the level pulling-up circuit comprises a fourth switch and a third node, wherein:

a gate of the fourth switch is connected to the second clock signal, a drain thereof is coupled to the output terminal of the first inverting circuit, and a source thereof is coupled to the third node;

the third node is the output terminal of the level pulling-up circuit.

In a detailed implementation, the first level pulling-down sub-circuit comprises a fifth switch and a sixth switch, wherein:

a gate of the fifth switch is coupled to the output terminal of the pre-charging circuit, a drain thereof is coupled to the output terminal of the level pulling-up circuit, and a source thereof is connected to the low level;

a gate of the six switch is connected to the first clock signal, a drain thereof is coupled to the output terminal of the level pulling-up circuit, and a source thereof is connected to the low level.

In a detailed implementation, the first level pulling-down sub-circuit comprises a fifth switch and a sixth switch, wherein:

a gate of the fifth switch is coupled to the output terminal of the second level pulling-down circuit, a drain thereof is coupled to the output terminal of the level pulling-up circuit, and a source thereof is connected to the low level;

a gate of the six switch is connected to the first clock signal, a drain thereof is coupled to the output terminal of the level pulling-up circuit, and a source thereof is connected to the low level.

In a detailed implementation, the second level pulling-down circuit comprises a second inverting circuit and a second level pulling-down sub-circuit, wherein:

the second inverting circuit pulls down the level at the output terminal of the second level pulling-down circuit and outputs the low level in response to the high level output from the first level pulling-down circuit, and outputs the high level in response to the low level output from the first level pulling-down circuit;

the second level pulling-down sub-circuit pulls down the high level output from the second inverting circuit and outputs the low level in response to the enable level of the first clock signal.

In a detailed implementation, the second inverting circuit comprises a eighth switch, a fourth node and a seventh switch, wherein:

a gate and a drain of the eighth switch are coupled to each other, the drain thereof is connected to the high level, and a source thereof is coupled to the fourth node;

the fourth node is the output terminal of the second level pulling-down circuit;

a gate of the seventh switch is connected to the output terminal of the first level pulling-down circuit, a drain thereof is coupled to the fourth node, and a source thereof is connected to the low level.

In a detailed implementation, the second level pulling-down sub-circuit comprises a ninth switch, wherein a gate of the ninth switch is connected to the first clock signal, a drain thereof is coupled to the output terminal of the second level pulling-down circuit, and a source thereof is connected to the low level.

According to an embodiment, the shift register includes at least two shift register unit circuits connected in cascade, wherein each of the shift register unit circuit operates based on two clock signals and is any one of the above-described shift register unit circuit.

According to an embodiment, there is provided a liquid crystal display array substrate on which a GOA circuit is disposed, and the shift register in the GOA circuit is the above-described shift register.

According to an embodiment, there is provided a liquid crystal display, which comprises a liquid crystal display array substrate as described above.

The disclosed technical solutions have advantageous effects as follows.

a) By using a design of double level pulling-down, the pulling-down for a TFT changes to an Alternating Current pulling-down from a Direct Current pulling-down, thus the problem that the threshold voltage of the pulling-down TFT would drift under the direct current bias voltage is settled, and in turn the TFT AC Duty Cycle is reduced.

b) Suspensions in the TFT output node and pulling-up nodes within the shift register unit circuit are decreased, and in turn a stray effect in the circuit is reduced.

c) Less TFTs (thin film transistor) are used in the shift register unit circuit to realize the GOA circuit, therefore its circuit structure is simple, its output is stable and power consumption is reduced clearly.

DETAILED DESCRIPTION

Below detailed implementations of the disclosed technical solution will be described in further details in connection with the accompanying drawings.

Figure 1:
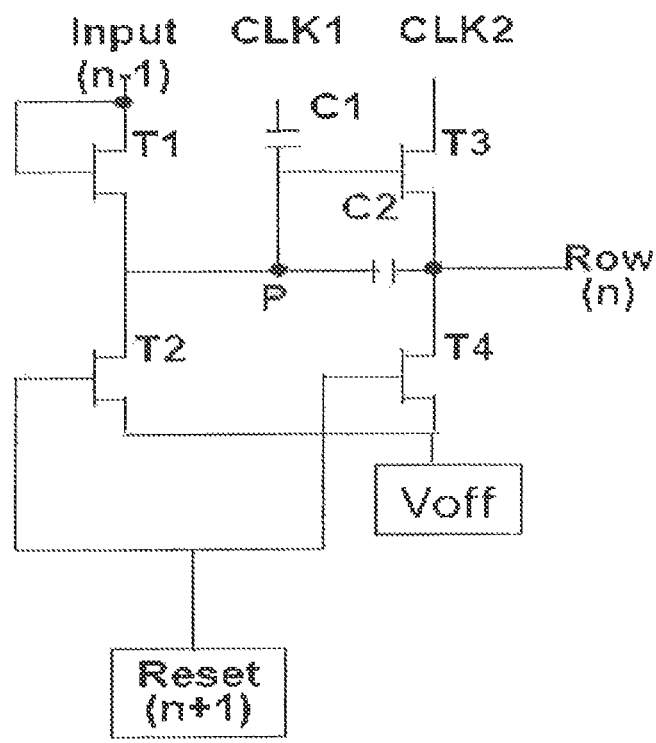
FIG. 1 is a basic principle diagram of a shift register unit circuit in a GOA circuit.
Figure 2:
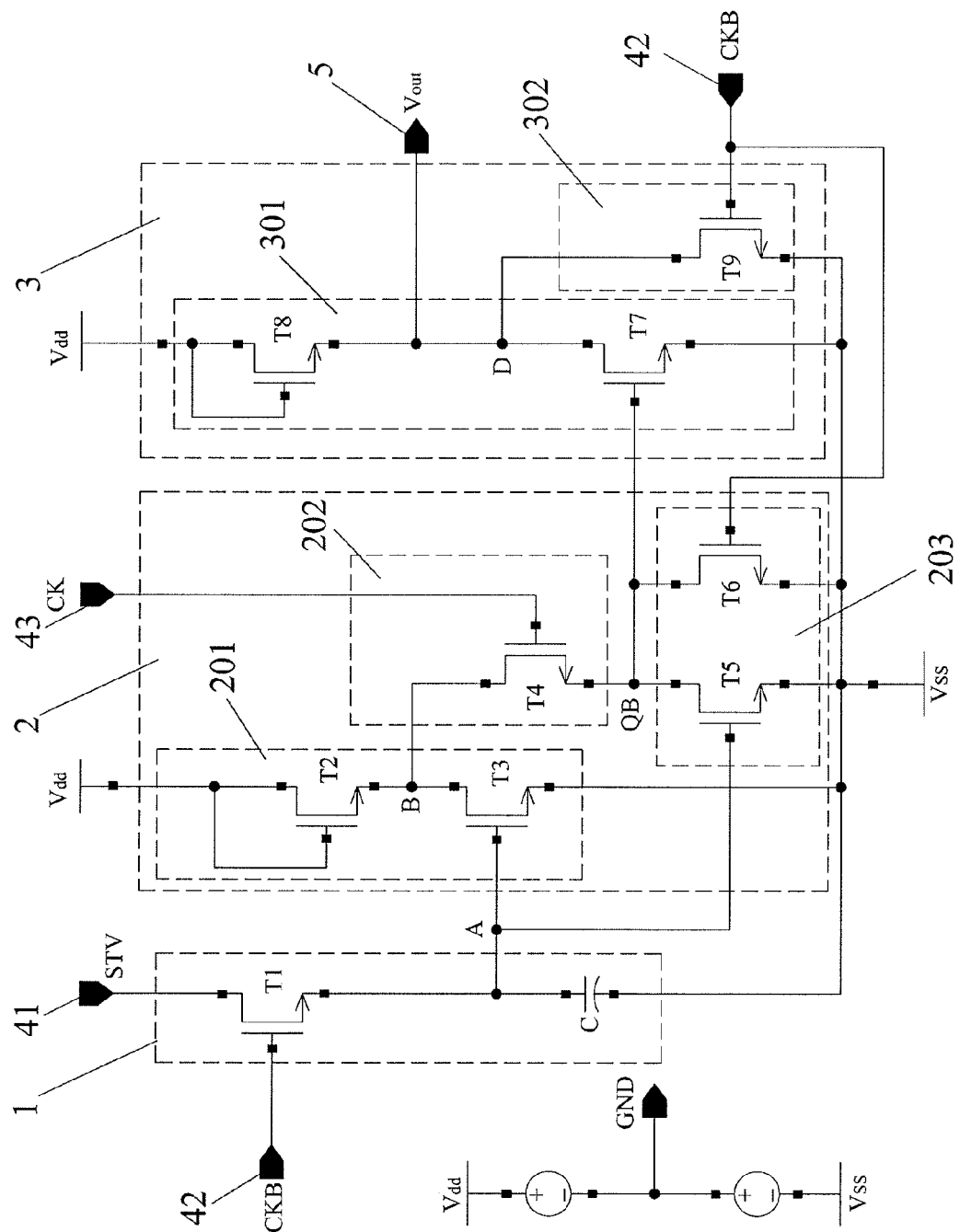
FIG. 2 is a schematic view of the shift register unit circuit according to an Embodiment 1 of the disclosed technical solution.

FIG. 2 illustrates a principle view of a shift register unit circuit according to one embodiment of the disclosed technical solution. The shift register unit circuit comprises: input terminals, a pre-charging circuit 1, a first level pulling-down circuit 2, a second level pulling-down circuit 3 and a scan signal output terminal 5, wherein:

the input terminals include a start signal input terminal 41, a first clock signal input terminal 42 and a second clock signal input terminal 43;

the pre-charging circuit 1 outputs a turn-on level in response to an enable level of a start signal and of a first clock signal, and keeps the turn-on level being output during one clock period of the first clock signal;

the first level pulling-down circuit 2 pulls down the turn-on level output from the pre-charging circuit 1 and outputs a low level, after the turn-on level is input; and outputs the low level in response to the enable level of the first clock signal and a disable level of a second clock signal, and outputs a high level in response to the disable level of the first clock signal and the enable level of the second clock signal, after the turn-on level is turned off;

the second level pulling-down circuit 3 which is coupled to an output terminal of the first level pulling-down circuit 2, pulls down a level at an output terminal of the second level pulling-down circuit 3 and outputs the low level in response to the high level output from the first pulling-down circuit 2; pulls down the level at the output terminal of the second level pulling-down circuit 3 and outputs the low level in response to the enable level of the first clock signal; and outputs the high level in response to the low level output from the first level pulling-down circuit 2 and the disable level of the first clock signal; and the scan signal output terminal 5 is coupled to the output terminal of the second level pulling-down circuit 3 and outputs a scan signal.

As a further embodiment of the disclosed technical solution, the first level pulling-down circuit 2 comprised a first inverting circuit 201, a level pulling-up circuit 202 and a first level pulling-down sub-circuit 203, wherein:

the first inverting circuit 201 pulls down the level at the output terminal of the first inverting circuit 201 and outputs the low level after the turn-on level is input; and outputs the high level after the turn-on level is turned off;

the level pulling-up circuit 202 pulls up the high level output from the first inverting circuit 201 and outputs a high level in response to the enable level of the second clock signal;

the first level pulling-down sub-circuit 203 pulls down the high level output from the level pulling-up circuit 202 and outputs the low level in response to the enable level of the first clock signal.

As a further embodiment of the disclosed technical solution, the second level pulling-down circuit comprises a second inverting circuit 301 and a second level pulling-down sub-circuit 302, wherein: the second inverting circuit 301 pulls down the level at the output terminal of the second level pulling-down circuit 3 and outputs the low level in response to the high level output from the first level pulling-down circuit 2, and the second inverting circuit 301 outputs the high level in response to the low level output from the first level pulling-down circuit 2; and the second level pulling-down sub-circuit 302 pulls down the high level output from the second inverting circuit 301 and outputs the low level in response to the enable level of the first clock signal.

Below the shift register unit circuit will be described in further details in connection with the detailed embodiments. In the following embodiments, an enabled level is a high level, and a disabled level is a low level.

Embodiment 1

FIG. 2 illustrates a shift register unit circuit according to an embodiment of the disclosed technical solution, and all of switches T1-T9 in this embodiment are TFTs (Thin Film Transistor). As can be seen from the figure, the pre-charging circuit 1 comprises a first switch T1, a first node A and a capacitor C. A gate of the first switch T1 is connected to a first clock signal CKB, a drain thereof is connected to a start signal (the start signal may be a STV signal or a level signal output from the shift register unit circuit in the previous stage), and the source thereof is coupled to the first node A; the first node A is a turn-on level output terminal of the pre-charging circuit 1; and one terminal of the capacitor C is coupled to the first node A, and the other terminal is coupled to a low level $V_{SS}$.

The first level pulling-down circuit 2 comprises a first inverting circuit 201, a level pulling-up circuit 202 and a first level pulling-down sub-circuit 203. The first inverting circuit 201 comprises a second switch T2, a second node B and a third switch T3, wherein: a gate and a drain of the second switch T2 are coupled to each other, the drain thereof is connected to a high level $V_{dd}$, and a source thereof is coupled to the second node B; the second node B is the output terminal of the first inverting circuit; a gate of the third switch T3 is connected to the turn-on level output terminal of the pre-charging circuit 1, a drain thereof is coupled to the second node B, and a source thereof is connected to the low level $V_{SS}$.

The level pulling-up circuit 202 comprises a fourth switch T4 and a third node QB, wherein: a gate of the fourth switch T4 is connected to the second clock signal CK, a drain thereof is coupled to the output terminal (that is, the node B) of the first inverting circuit 201, and a source thereof is coupled to the third node QB; the third node QB is the output terminal of the level pulling-up circuit 202.

The first level pulling-down sub-circuit 203 comprises a fifth switch T5 and a sixth switch T6, wherein: a gate of the fifth switch T5 is coupled to the output terminal of the pre-charging circuit 1, a drain thereof is coupled to the output terminal (that is, the node QB) of the level pulling-up circuit 202, and a source thereof is connected to the low level $V_{SS}$; a gate of the six switch T6 is connected to the first clock signal CKB, a drain thereof is coupled to the output terminal (that is, the node QB) of the level pulling-up circuit 202, and a source thereof is connected to the low level $V_{SS}$.

The second level pulling-down circuit 3 comprises a second inverting circuit 301 and a second level pulling-down sub-circuit 302. The second inverting circuit 301 comprises a eighth switch T8, a fourth node D and a seventh switch T7, wherein: a gate and a drain of the eighth switch T8 are coupled to each other, the drain thereof is connected to the high level $V_{dd}$, and a source thereof is coupled to the fourth node D; the fourth node D is the output terminal of the second level pulling-down circuit 3; a gate of the seventh switch T7 is connected to the output terminal (that is, the node QB) of the first level pulling-down circuit 2, a drain thereof is coupled to the fourth node D, and a source thereof is connected to the low level $V_{SS}$. The second level pulling-down sub-circuit 302 comprises a ninth switch T9, wherein a gate of the ninth switch T9 is connected to the first clock signal CKB, a drain thereof is coupled to the fourth node D, and a source thereof is connected to the low level $V_{SS}$.

Figure 4:
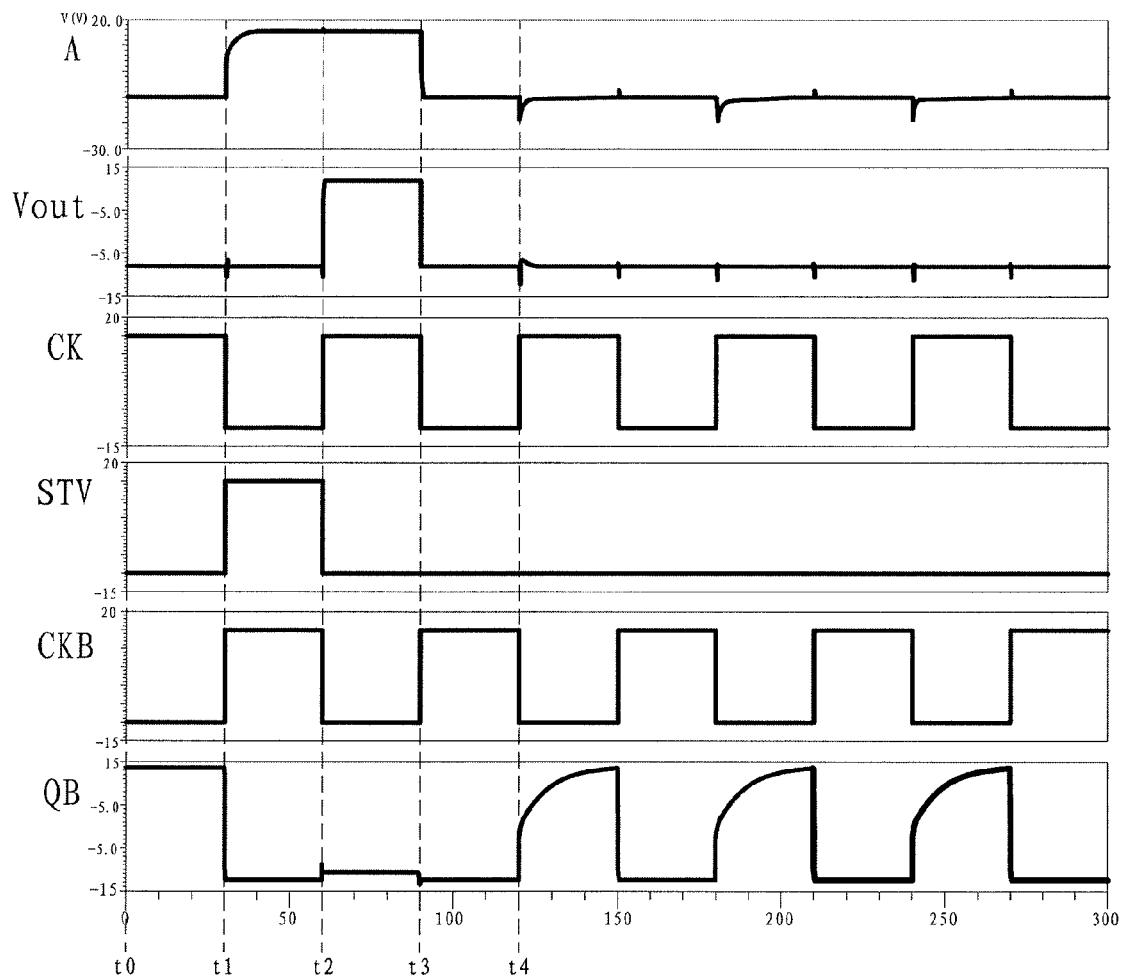
FIG. 4 is a timing diagram of the Embodiment 1 of the disclosed technical solution.

FIG. 4 illustrates an operating timing diagram of this embodiment. As shown in the FIG. 4, the above-described circuit is operated under the first clock signal CKB and the second clock signal CK which are input differentially. That is to say, the first clock signal CKB and the second clock signal CK are input differentially, therefore the second clock signal CK is at the low level when the first clock signal CKB is at the high level, while the second clock signal CK is at the high level when the first clock signal CKB is at the low level, and the first clock signal CKB and the second clock signal CK have a same clock period.

At a time period t0~t1 in the FIG. 4, the first clock signal CKB outputs the low level, and the second clock signal CK outputs the high level. At this time, the first switch T1 is turned off, the start signal coupled to the first switch T1 outputs the low level, that is, the node A outputs the low level. When the node A outputs the low level, the third switch T3 is turned off and the node B outputs the high level. When the node B outputs the high level, the fourth switch T4 is turned on because the second clock signal CK connected with the gate of the T4 is the high level, the fifth switch T5 is turned off because the node A coupled to its gate is at the low level, the sixth switch T6 is turned off because the first clock signal coupled to its gate is at low level, and the node QB outputs the high level. When the node QB outputs the high level, the seventh switch T7 is turned on, the ninth switch T9 is turned off because the first clock signal coupled to its gate is at the low level, and the scan signal output terminal $V_{out}$ outputs the low level.

At a time period t1~t2 in the FIG. 4, the first clock signal CKB outputs the high level, and the second clock signal CK outputs the low level. At this time, the first switch T1 whose gate is coupled to the first clock signal CKB is turned on, the start signal outputs the high level, and therefore the node A outputs the high level and at the same time the capacitor C is charged. The third switch T3 is turned on and the node B outputs the low level, when the node A outputs the high level; the fourth switch T4 is turned off because the second clock signal CK is at the low level, the fifth switch T5 is turned on because the node A outputs the high level, the sixth switch T6 is turned on because the first clock signal CKB outputs the high level, and therefore the node QB outputs the low level; when the node QB is at the low level, the seventh switch T7 is turned off, the ninth switch T9 is turned on because the first clock signal CKB outputs the high level, and therefore the scan signal output terminal $V_{out}$ outputs the low level during this time period.

At a time period t2~t3 in the FIG. 4, the first clock signal CKB outputs the low level, and the second clock signal CK outputs the high level. At this time, the start signal outputs the low level and the capacitor C is stopped being charged. The capacitor C starts to discharge, and the node A maintains to output the high level until the discharging of the capacitor C is completed (that is, the time t3 in the figure). The third switch T3 is turned on and the node B outputs the low level, when the node A outputs the high level. At this time, the second clock signal CK outputs the high level so as to turn on the fourth switch T4, while the fifth switch 15 is turned on because the node A outputs the high level, the sixth switch T6 is turned off because the first clock signal CKB outputs the low level, and the low level outputted from the node QB in case that the fourth switch T4 is turned on is pulled-up slightly (as shown in FIG. 4); the level outputted from the node QB, which is pulled-up slightly, is not enough to turn on the seventh switch T7, the ninth switch T9 is turned off because the first clock signal CKB outputs the low level. At this time, the eighth switch and the seventh switch form a circuit having a structure like the inverter 201, thus the low level from the node QB is inverted and outputted, that is, the scan signal output terminal $V_{out}$ outputs the high level during this time period.

At time period t3~t4 in the FIG. 4, the first clock signal CKB outputs the high level, and the second clock signal CK outputs the low level. The switch T1 is turned on since the first clock signal CKB outputs the high level, but the start signal coupled to the drain of the first switch T1 outputs the low level and the discharging of the capacitor C is completed, therefore the node A outputs the low level. When the node A outputs the low level, the third switch T3 is turned off so that the node B outputs the high level, the fourth switch T4 is turned off because the second clock signal CK outputs the low level, the fifth switch T5 is turned off because the node A outputs the low level, the sixth switch T6 is turned on because the first clock signal CKB outputs the high level. Therefore, the node QB outputs the low level, the seventh switch T7 is turned off, and the ninth switch T9 is turned on because the first clock signal CKB outputs the high level, so that the level of the scan signal output terminal $V_{out}$ is pulled-down during this time period and the low level is outputted.

During subsequent periods (that is, after the time t4), because the node A is always at the low level, the T3 and T5 are always turned off and the node B is always at the high level. When the first clock signal CKB outputs the low level and the second clock signal CK outputs the high level, since both of the fifth switch T5 and the sixth switch T6 are turned off and would present characteristics of a capacitor, the high level outputted from the node QB may not be a stable high level but may fluctuate (as shown after the time t4 in FIG. 4). On the contrary, when the first clock signal CKB outputs the high level and the second clock signal CK outputs the low level, the node QB outputs the low level. The seventh switch T7 is turned on when the node QB outputs the high level, the ninth switch T9 is turned off at this time because of the low level outputted from the first clock signal CKB, therefore the seventh switch T7 and the eighth switch T8 from a inverter so as to invert the level outputted from the node QB; when the first clock signal CKB outputs the high level, the ninth switch T9 is turned on in order to pull-down the level outputted from the scan signal output terminal therefore the stability of the low level outputted from the scan signal output terminal $V_{out}$ could be ensured.

After time t4, the scan signal output terminal $V_{out}$ would always outputs the low level as long as the start signal does not output the high level, regardless how the first clock signal CKB and the second clock signal CK change. When the start signal outputs the high level again, the above-described shift register unit circuit would repeat the operation timing from t0 again.

Embodiment 2

Figure 3:
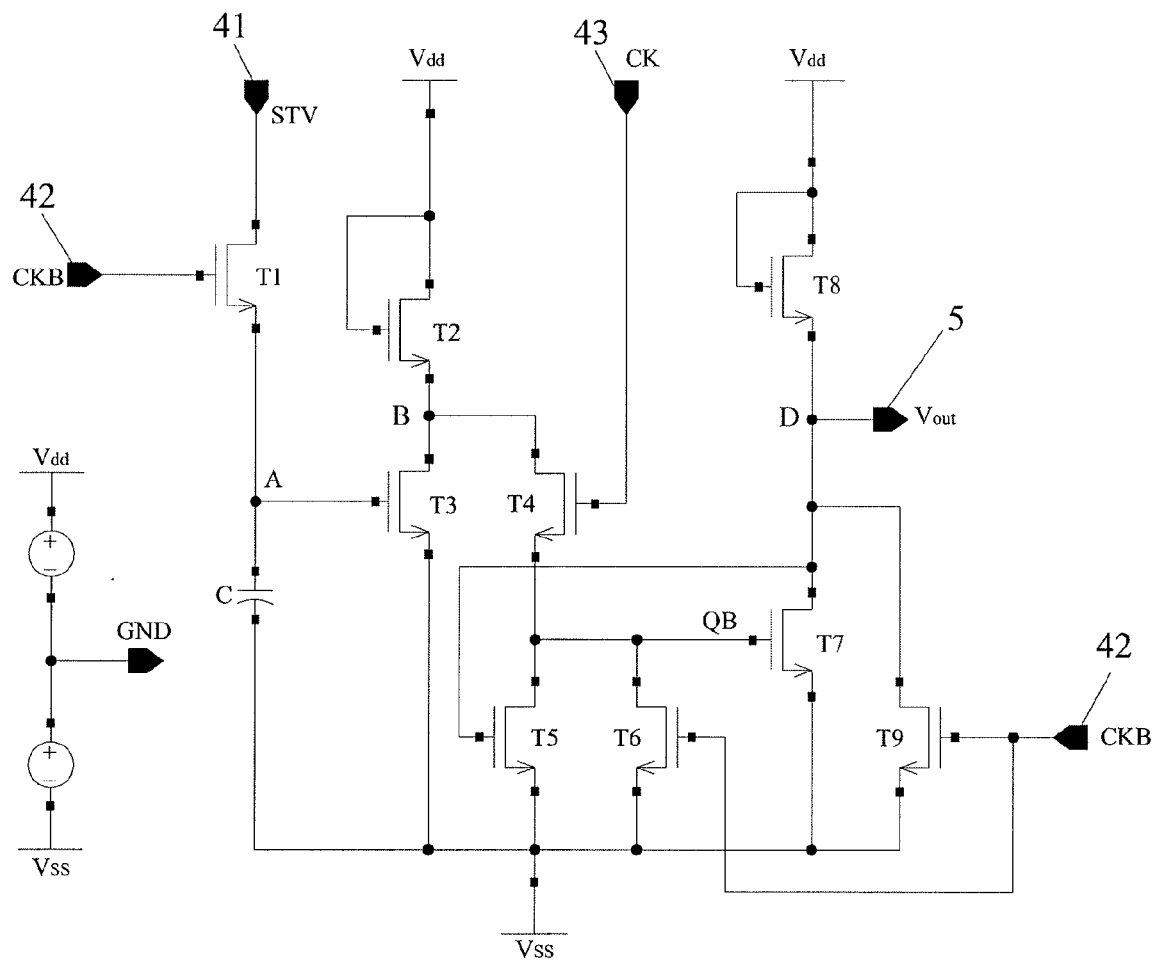
FIG. 3 is a schematic view of the shift register unit circuit according to an Embodiment 2 of the disclosed technical solution.

FIG. 3 illustrates a shift register unit circuit according to another embodiment of the disclosed technical solution. This embodiment only changes the gate of the fifth switch T5 in the Embodiment 1 as being coupled to the output terminal of the second level pulling-down circuit. Since the timing diagram of the level outputted at the node A is the same as that of the scan signal output terminal $V_{out}$ after time t2, the effects on the T5 are the same, that is, the operation principle of this embodiment is the same as the Embodiment 1.

Figure 5:
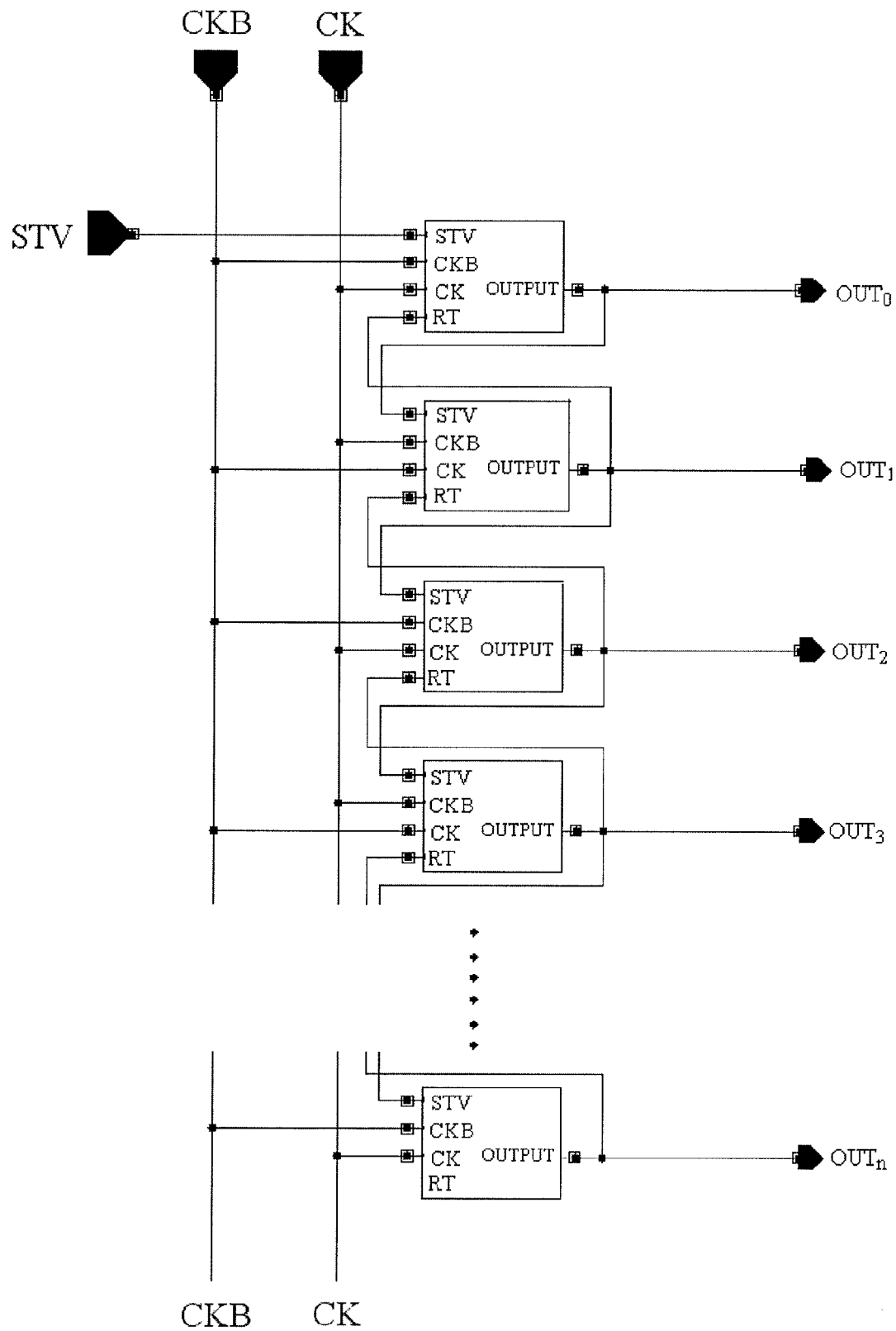
FIG. 5 is a schematic view illustrating a structure of a shift register according to the embodiment of the disclosed technical solution.

As shown in FIG. 5, the shift register comprises multiple stages of the shift register units $S_1, S_2, \ldots, S_n$, wherein respective stages of the shift register units generate their scan signals at respective output terminals ($OUT_0, OUT_1, OUT_2, \ldots, OUT_n$). The shift register unit at each stage has a first clock input port CKB, a second clock input port CK, a start signal input port, a reset signal input port RT and a scan signal output port $OUT_n$. All of the shift register units at respective stages utilize the shift register unit circuits with the above-described circuit structure. Wherein, In the shift register unit $S_1$ at the first stage, the start signal STV is input to its start signal input port, the first clock signal is input to its first clock input port, the second clock signal is input to its second clock input port, and its reset signal input port is connected to the scan signal output port of the shift register unit at the next stage;

In the shift register unit $S_2$ at a stage just next to the first stage, a scan signal output from the shift register unit $S_1$ at the first stage is input to a start signal input port of the shift register unit $S_2$, the second clock signal is input to its first clock input port, the first clock signal is input to its second clock input port, and its reset signal input port is connected to the scan signal output port of the shift register unit at the next stage;

The rest can be done in the same way until the shift register unit $S_n$, and for a shift register unit $S_n$ which is connected in cascade at the last stage, no reset signal is needed to be input.

It is noted that, in the shift register unit $S_n$ where n is an odd number, the first clock signal should be input to its first clock input port and the second clock signal should be input to its second clock input port. Instead, in the shift register unit $S_n$ where n is an even number, the second clock signal should be input to its first clock input port and the first clock signal should be input to its second clock input port.

Figure 6:
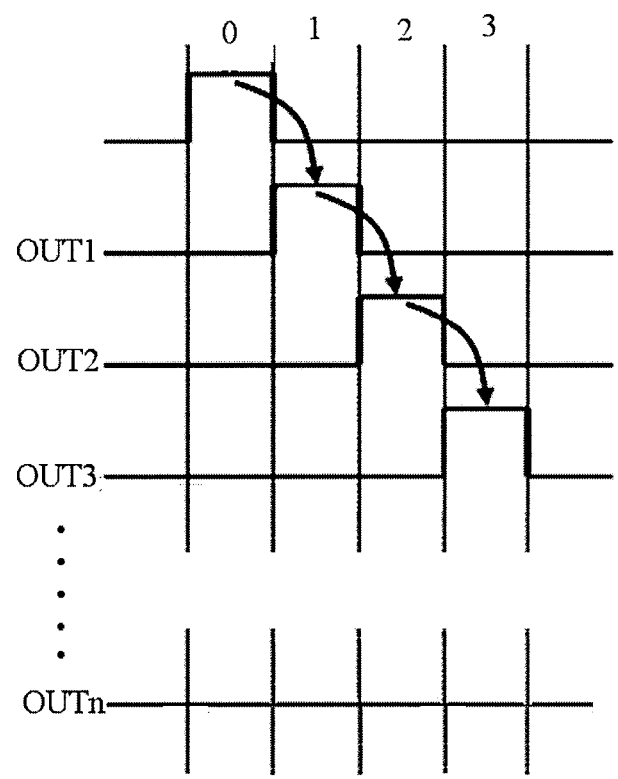
FIG. 6 is a schematic view illustrating a process for outputting gate scan signals line-by-line from top to bottom in the shift register according to the embodiment of the disclosed technical solution.

As shown in FIG. 6, the shift register operates under two clocks and outputs the gate scan signals line-by-line from top to bottom.

A liquid crystal display array substrate according to an embodiment of the disclosed technical solution has a GOA circuit disposed on it, a shift register of the GOA circuit has a structure including at least two shift register unit circuits connected in cascade (as shown in FIG. 5) and operates based on two-phase clock signal. Wherein, the shift register unit circuit comprises:

input terminals including a start signal input terminal, a first clock signal input terminal and a second clock signal input terminal;

a pre-charging circuit for outputting a turn-on level in response to an enable level of a start signal and of a first clock signal, and keeping the turn-on level being output during one clock period of the first clock signal;

a first level pulling-down circuit for pulling down a turn-on level output from the pre-charging circuit and outputting a low level, after the turn-on level is input; and for outputting the low level in response to a disable level of the second clock signal, and outputting a high level in response to the enable level of the second clock signal, after the turn-on level is turned off;

a second level pulling-down circuit, which is coupled to an output terminal of the first level pulling-down circuit, for inverting a level output from the first level pulling-down circuit in response to the disable level of the first clock signal; and for pulling down the inverted level output from the first level pulling-down circuit in response to the enable level of the first clock signal; and a scan signal output terminal, which is coupled to the output terminal of the second level pulling-down circuit, for outputting a scan signal.

The scan signal output terminal above-described is connected to a corresponding gate scan line on the array substrate and is used to provide a respective gate driving signal of the gate scan line.

In a liquid crystal display array substrate according to an embodiment of the disclosed technical solution, the first level pulling-down circuit comprises a first inverting circuit, a level pulling-up circuit and a first level pulling-down sub-circuit, wherein:

the first inverting circuit inverts a level output from the pre-charging circuit and outputs it;

the level pulling-up circuit pulls up the high level output from the first inverting circuit and outputs a high level in response to the enable level of the second clock signal;

the first level pulling-down sub-circuit pulls down the high level output from the level pulling-up circuit and outputs a low level in response to the enable level of the first clock signal.

In a liquid crystal display array substrate according to an embodiment of the disclosed technical solution, the second level pulling-down circuit comprises a second inverting circuit and a second level pulling-down sub-circuit, wherein:

the second inverting circuit inverts a level output from the first level pulling-down circuit and output it in response to the disable level of the first clock signal;

the second level pulling-down sub-circuit pulls down the inverted level output from the first level pulling-down circuit and outputs the low level in response to the enable level of the first clock signal.

The shift register unit circuit integrated on the liquid crystal display array substrate according to an embodiment of the disclosed technical solution may further be the circuit having the structures as described in the above Embodiment 1 (as shown in FIG. 2) and Embodiment 2 (as shown in FIG. 3).

A liquid crystal display according to an embodiment of the disclosed technical solution comprises a liquid crystal display array substrate having the above-described structure.

The above are only exemplary embodiments of the disclosed solution, but the scope sought for protection is not limited thereto. Instead, any or all modifications or replacements as would be obvious to those skilled in the art are intended to be included within the scope of the present invention. Therefore, the scope of the present invention is defined in the appended claims.

What is claimed is:

1. A shift register unit circuit, comprising:
input terminals including a start signal input terminal, a first clock signal input terminal and a second clock signal input terminal;

a pre-charging circuit for outputting a turn-on level in response to an enable level of a start signal and of a first clock signal, and keeping the turn-on level being output during one clock period of the first clock signal;

a first level pulling-down circuit for pulling down the turn-on level output from the pre-charging circuit and outputting a low level, after the turn-on level is input; and for outputting the low level in response to the enable level of the first clock signal and a disable level of a second clock signal, and outputting a high level in response to a disable level of the first clock signal and an enable level of the second clock signal, after the turn-on level is turned off;

a second level pulling-down circuit, which is coupled to an output terminal of the first level pulling-down circuit, for pulling down a level at an output terminal of the second level pulling-down circuit and outputting the low level in response to the high level output from the first pulling-down circuit; for pulling down the level at the output terminal of the second level pulling-down circuit and outputting the low level in response to the enable level of the first clock signal; and for outputting the high level in response to the low level output from the first level pulling-down circuit and the disable level of the first clock signal; and a scan signal output terminal, which is coupled to the output terminal of the second level pulling-down circuit, for outputting a scan signal.

2. The shift register unit circuit according to claim 1, wherein the first level pulling-down circuit comprises a first inverting circuit, a level pulling-up circuit and a first level pulling-down sub-circuit, wherein:

the first inverting circuit pulls down a level at an output terminal of the first inverting circuit and outputs the low level, after the turn-on level is input; and outputs a high level after the turn-on level is turned off;

the level pulling-up circuit pulls up the high level output from the first inverting circuit and outputs a high level in response to the enable level of the second clock signal; and the first level pulling-down sub-circuit pulls down the high level output from the level pulling-up circuit and outputs the low level in response to the enable level of the first clock signal.

3. The shift register unit circuit according to claim 2, wherein the pre-charging circuit comprises a first switch, a first node and a capacitor, wherein:

a gate of the first switch is connected to the first clock signal, a drain thereof is connected to the start signal, and a source thereof is coupled to the first node;

the first node is a turn-on level output terminal of the pre-charging circuit; and one terminal of the capacitor is coupled to the first node, and another terminal is coupled to the low level.

4. The shift register unit circuit according to claim 2, wherein the first inverting circuit comprises a second switch, a second node and a third switch, wherein:

a gate and a drain of the second switch are coupled to each other, the drain is connected to the high level, and a source of the second switch is coupled to the second node;

the second node is the output terminal of the first inverting circuit; and a gate of the third switch is connected to the turn-on level output terminal of the pre-charging circuit, a drain thereof is coupled to the second node, and a source thereof is connected to the low level.

5. The shift register unit circuit according to claim 2, wherein the level pulling-up circuit comprises a fourth switch and a third node, wherein:
   a gate of the fourth switch is connected to the second clock signal, a drain thereof is coupled to the output terminal of the first inverting circuit, and a source thereof is coupled to the third node; and
   the third node is an output terminal of the level pulling-up circuit.

6. The shift register unit circuit according to claim 2, wherein the first level pulling-down sub-circuit comprises a fifth switch and a sixth switch, wherein:
   a gate of the fifth switch is coupled to the output terminal of the pre-charging circuit, a drain thereof is coupled to the output terminal of the level pulling-up circuit, and a source thereof is connected to the low level; and
   a gate of the six switch is connected to the first clock signal, a drain thereof is coupled to the output terminal of the level pulling-up circuit, and a source thereof is connected to the low level.

7. The shift register unit circuit according to claim 2, wherein the first level pulling-down sub-circuit comprises a fifth switch and a sixth switch, wherein:
   a gate of the fifth switch is coupled to the output terminal of the second level pulling-down circuit, a drain thereof is coupled to the output terminal of the level pulling-up circuit, and a source thereof is connected to the low level; and
   a gate of the six switch is connected to the first clock signal, a drain thereof is coupled to the output terminal of the level pulling-up circuit, and a source thereof is connected to the low level.

8. The shift register unit circuit according to claim 2, wherein the second level pulling-down circuit comprises a second inverting circuit and a second level pulling-down sub-circuit, wherein:
   the second inverting circuit pulls down the level at the output terminal of the second level pulling-down circuit and outputs the low level in response to the high level output from the first level pulling-down circuit, and outputs the high level in response to the low level output from the first level pulling-down circuit; and
   the second level pulling-down sub-circuit pulls down the high level output from the second inverting circuit and outputs the low level in response to the enable level of the first clock signal.

9. The shift register unit circuit according to claim 1, wherein the pre-charging circuit comprises a first switch, a first node and a capacitor, wherein:
   a gate of the first switch is connected to the first clock signal, a drain thereof is connected to the start signal, and a source thereof is coupled to the first node;
   the first node is a turn-on level output terminal of the pre-charging circuit; and
   one terminal of the capacitor is coupled to the first node, and another terminal is coupled to the low level.

10. The shift register unit circuit according to claim 1, wherein the second level pulling-down circuit comprises a second inverting circuit and a second level pulling-down sub-circuit, wherein:
    the second inverting circuit pulls down the level at the output terminal of the second level pulling-down circuit and outputs the low level in response to the high level output from the first level pulling-down circuit, and outputs the high level in response to the low level output from the first level pulling-down circuit; and
    the second level pulling-down sub-circuit pulls down the high level output from the second inverting circuit and outputs the low level in response to the enable level of the first clock signal.

11. The shift register unit circuit according to claim 10, wherein the second inverting circuit comprises an eighth switch, a fourth node and a seventh switch, wherein:
    a gate and a drain of the eighth switch are coupled to each other, the drain thereof is connected to the high level, and a source thereof is coupled to the fourth node;
    the fourth node is the output terminal of the second level pulling-down circuit; and
    a gate of the seventh switch is connected to the output terminal of the first level pulling-down circuit, a drain thereof is coupled to the fourth node, and a source thereof is connected to the low level.

12. The shift register unit circuit according to claim 11, wherein the second level pulling-down sub-circuit comprises a ninth switch, wherein a gate of the ninth switch is connected to the first clock signal, a drain thereof is coupled to the output terminal of the second level pulling-down circuit, and a source thereof is connected to the low level.

13. The shift register unit circuit according to claim 10, wherein the second level pulling-down sub-circuit comprises a ninth switch, wherein a gate of the ninth switch is connected to the first clock signal, a drain thereof is coupled to the output terminal of the second level pulling-down circuit, and a source thereof is connected to the low level.

14. A shift register having at least two shift register unit circuits connected in cascade, the shift register unit circuit comprising:
    input terminals including a start signal input terminal, a first clock signal input terminal and a second clock signal input terminal;
    a pre-charging circuit for outputting a turn-on level in response to an enable level of a start signal and of a first clock signal, and keeping the turn-on level being output during one clock period of the first clock signal;
    a first level pulling-down circuit for pulling down the turn-on level output from the pre-charging circuit and outputting a low level, after the turn-on level is input; and for outputting the low level in response to the enable level of the first clock signal and a disable level of a second clock signal, and outputting a high level in response to a disable level of the first clock signal and an enable level of the second clock signal, after the turn-on level is turned off;
    a second level pulling-down circuit, which is coupled to an output terminal of the first level pulling-down circuit, for pulling down a level at an output terminal of the second level pulling-down circuit and outputting the low level in response to the high level output from the first pulling-down circuit; for pulling down the level at the output terminal of the second level pulling-down circuit and outputting the low level in response to the enable level of the first clock signal; and for outputting the high level in response to the low level output from the first level pulling-down circuit and the disable level of the first clock signal; and
    a scan signal output terminal, which is coupled to the output terminal of the second level pulling-down circuit, for outputting a scan signal.

15. The shift register according to claim 14, wherein the first level pulling-down circuit comprises a first inverting circuit, a level pulling-up circuit and a first level pulling-down sub-circuit, wherein:

the first inverting circuit pulls down a level at an output terminal of the first inverting circuit and outputs the low level, after the turn-on level is input; and outputs the high level after the turn-on level is turned off;

the level pulling-up circuit pulls up the high level output from the first inverting circuit and outputs a high level in response to the enable level of the second clock signal; and the first level pulling-down sub-circuit pulls down the high level output from the level pulling-up circuit and outputs the low level in response to the enable level of the first clock signal.

16. The shift register according to claim 15, wherein the second level pulling-down circuit comprises a second inverting circuit and a second level pulling-down sub-circuit, wherein:

the second inverting circuit pulls down the level at the output terminal of the second level pulling-down circuit and outputs the low level in response to the high level output from the first level pulling-down circuit, and outputs the high level in response to the low level output from the first level pulling-down circuit; and the second level pulling-down sub-circuit pulls down the high level output from the second inverting circuit and outputs the low level in response to the enable level of the first clock signal.

17. The shift register according to claim 14, wherein the second level pulling-down circuit comprises a second inverting circuit and a second level pulling-down sub-circuit, wherein:

the second inverting circuit pulls down the level at the output terminal of the second level pulling-down circuit and outputs the low level in response to the high level output from the first level pulling-down circuit, and outputs the high level in response to the low level output from the first level pulling-down circuit; and the second level pulling-down sub-circuit pulls down the high level output from the second inverting circuit and outputs the low level in response to the enable level of the first clock signal.

18. A liquid crystal display including a liquid crystal display array substrate having a GOA circuit disposed thereon, a shift register in the GOA circuit including at least two shift register unit circuits connected in cascade, the shift register unit circuit comprising:

input terminals including a start signal input terminal, a first clock signal input terminal and a second clock signal input terminal;

a pre-charging circuit for outputting a turn-on level in response to an enable level of a start signal and of a first clock signal, and keeping the turn-on level being output during one clock period of the first clock signal;

a first level pulling-down circuit for pulling down the turn-on level output from the pre-charging circuit and outputting a low level, after the turn-on level is input; and for outputting the low level in response to the enable level of the first clock signal and a disable level of a second clock signal, and outputting a high level in response to a disable level of the first clock signal and an enable level of the second clock signal, after the turn-on level is turned off;

a second level pulling-down circuit, which is coupled to an output terminal of the first level pulling-down circuit, for pulling down a level at an output terminal of the second level pulling-down circuit and outputting the low level in response to the high level output from the first pulling-down circuit; for pulling down the level at the output terminal of the second level pulling-down circuit and outputting the low level in response to the enable level of the first clock signal; and for outputting the high level in response to the low level output from the first level pulling-down circuit and the disable level of the first clock signal; and a scan signal output terminal, which is coupled to the output terminal of the second level pulling-down circuit, for outputting a scan signal.

* * * * *